US012601087B2

(12) United States Patent
Nakamura

(10) Patent No.: US 12,601,087 B2
(45) Date of Patent: Apr. 14, 2026

(54) HEAT-RESISTANT MEMBER

(71) Applicant: KABUSHIKI KAISHA TOYOTA CHUO KENKYUSHO, Nagakute (JP)

(72) Inventor: Daisuke Nakamura, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 343 days.

(21) Appl. No.: 18/269,888

(22) PCT Filed: Jan. 25, 2022

(86) PCT No.: PCT/JP2022/002685
§ 371 (c)(1),
(2) Date: Jun. 27, 2023

(87) PCT Pub. No.: WO2022/190682
PCT Pub. Date: Sep. 15, 2022

(65) Prior Publication Data
US 2024/0068128 A1    Feb. 29, 2024

(30) Foreign Application Priority Data
Mar. 11, 2021    (JP) ................................. 2021-038865

(51) Int. Cl.
*C30B 23/00*        (2006.01)
*C30B 35/00*        (2006.01)
(52) U.S. Cl.
CPC ............ *C30B 35/002* (2013.01); *C30B 23/00* (2013.01)
(58) Field of Classification Search
CPC ........ C30B 23/00; C30B 23/02; C30B 35/002
See application file for complete search history.

(56) References Cited

U.S. PATENT DOCUMENTS

2013/0061800 A1*  3/2013  Nakamura ......... C04B 41/5057
                                              427/372.2
2019/0330765 A1*  10/2019  Fujikawa .............. C30B 25/105
2021/0154976 A1*  5/2021  Nakamura .............. C04B 41/89

FOREIGN PATENT DOCUMENTS

JP          2013-075814 A      4/2013
JP          2013-193943 A      9/2013
            (Continued)

OTHER PUBLICATIONS

Nakamura et al.; "Fabrication of large-sized TaC-coated carbon crucibles for the low-cost sublimation growth of large-diameter bulk SiC crystals;" Japanese Journal of Applied Physics; 2017; pp. 1-7; vol. 56, No. 085504.
(Continued)

*Primary Examiner* — Robert M Kunemund
(74) *Attorney, Agent, or Firm* — Oliff PLC

(57) ABSTRACT

A heat-resistant member comprises: a substrate made of isotropic graphite; a single-layered dense low-emissivity layer covering part of surfaces of the substrate; and a single-layered or multi-layered dense high-emissivity layer covering all or part of the remaining surfaces of the substrate. The dense low-emissivity layer has an outermost surface with an emissivity of $\varepsilon_A$, and has a relative density of 97% or more. The dense high-emissivity layer has an outermost surface with an emissivity of $\varepsilon_B$ ($>\varepsilon_A$), and has a high-density region with a relative density of 97% or more in any portion between the outermost surface and the interface with the substrate. Preferably, an emissivity difference ($\varepsilon_B-\varepsilon_A$) is 0.1 or more.

14 Claims, 6 Drawing Sheets

(56) References Cited

FOREIGN PATENT DOCUMENTS

| JP | 2015-044719 A | 3/2015 |
|----|---------------|--------|
| JP | 2016-037441 A | 3/2016 |
| JP | 2017-075075 A | 4/2017 |
| JP | 2018-145022 A | 9/2018 |
| JP | 2020-11866 * | 1/2020 |
| JP | 2020-011866 A | 1/2020 |
| JP | 2020-063175 A | 4/2020 |

OTHER PUBLICATIONS

Daisuke Nakamura; "Simple and quick enhancement of SiC bulk crystal growth using a newly developed crucible material;" Applied Physics Express; 2016; pp. 1-4; vol. 9, No. 055507.

Nakamura et al.; "Resistive heater element made of highly durable TaC-coated graphite for high-temperature and highly corrosive processess: application to MOCVD GaN epitaxial growth;" Japanese Journal of Applied Physics; 2019; pp. 1-9; vol. 58, No. 075509.

Sep. 13, 2022 Office Action issued in Japanese Patent Application No. 2021-038865.

Mar. 22, 2022 Search Report issued in International Patent Application No. PCT/JP2022/002685.

Mar. 22, 2022 Written Opinion of the International Searching Authority issued in International Patent Application No. PCT/JP2022/002685.

* cited by examiner

HEAT-RESISTANT MEMBER

FIELD OF THE INVENTION

The present invention relates to a heat-resistant member, and more particularly to a heat-resistant member having high corrosion resistance to high-temperature corrosive gas and having different emissivity depending on portions.

BACKGROUND OF THE INVENTION

Semiconductor processes, such as bulk single crystal growth and epitaxial film formation of SiC or a group III nitride semiconductor, are severe in process condition. Members such as crucibles and susceptors (hereinafter collectively referred to as "heat-resistant members") used in such processes are exposed to a high-temperature and highly corrosive atmosphere during the respective processes. A SiC-coated graphite material or a pBN-coated graphite material has been used for such heat-resistant members. However, such a material disadvantageously has short life under current semiconductor process environment.

Thus, various approaches have been provided to overcome such a disadvantage.

For example, Patent Literature 1 discloses a high-temperature heat-resistant member including a graphite substrate made of isotropic graphite and a TaC film having a non-oriented granular structure covering a surface of the graphite substrate.

The literature describes that (A) since the TaC film has the non-oriented granular structure, a crack is less likely to propagate, (B) as a result, the graphite substrate is protected even when the high-temperature heat-resistant member is used for a long time under a high-temperature atmosphere, and (C) such a high-temperature heat-resistant member can be used, for example, as a susceptor member for MOCVD epitaxial growth of a group III nitride.

Patent Literature 2 discloses a high-temperature heat-resistant member including a graphite substrate with chamfered corners and a TaC film covering the surface of the graphite substrate.

The literature describes that (A) if the surface of the graphite substrate has a corner, local cracking, lifting, separation, or the like of the TaC film is likely to occur during film formation or in use, and (B) chamfering of the corner of the graphite substrate can suppress cracking, lifting, separation, or the like of the TaC film during film formation or in use.

Patent Literature 3 discloses a method for manufacturing a heat-resistant graphite member, in which (a) a slurry containing TaC particles is applied to a surface of a graphite substrate to form a coating film, (b) the coating film is dried to form a formed film, (c) the surface of the formed film is polished to reduce surface roughness or surface undulation of the formed film, and (d) the formed film is heated to sinter the TaC particles to produce a sintered film.

The literature describes that (A) if processing such as polishing or grinding is performed on the sintered film, a microcrack may occur in the sintered film, and (B) when the formed film is polished instead of the sintered film, polishing is performed easily.

Patent Literature 4 discloses a heat-resistant graphite member, in which a TaC film is formed on the surface of a graphite substrate, and the graphite substrate has a coefficient of thermal expansion (CTE) of 5.8 to $6.4 \times 10^{-6}$/K and a bulk density of 1.83 to 2.0 g/cm$^3$.

The literature describes that when the TaC film is formed on the surface of the graphite substrate, optimizing the CTE and bulk density of the graphite substrate improves durability and heat resistance.

Patent Literature 5 discloses a high heat-resistant member, in which the surface of a substrate made of isotropic graphite is coated with a TaC film, and an iron content of the TaC film is 20 to 1000 ppm by mass.

The literature describes that optimizing the iron content of the TaC film suppresses occurrence of cracks in the TaC film and thus improves heat resistance of the TaC film.

Patent Literature 6 discloses a crystal growth member including a substrate made of a carbon-based material, a protective layer made of TaC or SiC formed on the surface of the substrate, and a parasitic reaction preventing layer made of W, Mo, Ru and/or Ir formed on the surface of the protective layer.

The literature describes that forming the protective layer and the parasitic reaction preventing layer on the surface of the substrate provides a crystal growth member with both the protective function and the parasitic reaction preventing function.

Patent Literature 7 discloses an auxiliary heating member, in which a coating layer having a smaller emissivity than graphite is formed on the surface of graphite.

The literature describes that (A) if only the periphery of a crucible is heated by induction heating from the outer circumferential side of the crucible, a region close to the central axis of the crucible has lower temperature, and raw material powder located in the region close to the central axis of the crucible is not sufficiently sublimated, leading to low growth rate of single crystal, and (B) when the auxiliary heating member is disposed so as to face the bottom wall of the crucible, a lower wall portion of the crucible is heated by radiant heat from the auxiliary heating member, and temperature rises in the region close to the central axis of the crucible, and thus the raw material powder located in the region close to the central axis of the crucible is sufficiently sublimated.

Non-Patent Literature 1 discloses a TaC-coated graphite crucible produced by a wet ceramics process.

The literature describes that (A) in the case of growing SiC single crystal by a sublimation method, using the TaC-coated graphite crucible instead of the graphite crucible can increase growth rate over a long period of time, and (B) as a result, crystal size can be increased by roughly 1.2 times.

Further, Non-Patent Literature 2 discloses a TaC-coated graphite member produced using a powder forming and sintering method.

The literature describes that (A) when the TaC layer is formed on a surface of graphite having a thermal expansion coefficient difference Aa from TaC of about $2 \times 10^{-6}$, a crack occurs in a TaC layer, and (B) when the TaC layer is formed on a surface of graphite having a thermal expansion coefficient difference Aa from TaC of about $0.02 \times 10^{-6}$, warpage of the member is minimized.

As described in the Patent Literatures 1 to 7 and the Non-Patent Literatures 1 and 2, coating the surface of graphite with TaC improves chemical stability and expectably extends service life of the member. Unfortunately, since TaC has a smaller emissivity than graphite, it may be difficult in some cases to replace a graphite member with a TaC-coated graphite member. Furthermore, the heat-resistant member may have a different optimum emissivity depending on portions. Unfortunately, there has been no case of providing a heat-resistant member having high durability capable of withstanding actual use environment and different emissivity depending on portions.

CITATION LIST

Patent Literature

Patent Literature 1: Japanese Unexamined Patent Application Publication No. 2013-075814.
Patent Literature 2: Japanese Unexamined Patent Application Publication No. 2013-193943.
Patent Literature 3: Japanese Unexamined Patent Application Publication No. 2015-044719.
Patent Literature 4: Japanese Unexamined Patent Application Publication No. 2017-075075.
Patent Literature 5: Japanese Unexamined Patent Application Publication No. 2018-145022.
Patent Literature 6: Japanese Unexamined Patent Application Publication No. 2020-063175.
Patent Literature 7: Japanese Unexamined Patent Application Publication No. 2016-037441.

Non-Patent Literature

Non-Patent Literature 1: D. Nakamura: Appl. Phys. Express 9 (2016) 055507.
Non-Patent Literature 2: D. Nakamura and K. Shigetoh: Jpn. J. Appl. Phys. 56 (2017) 085504.

SUMMARY OF THE INVENTION

A problem to be solved by the present invention is to provide a novel heat-resistant member that has high corrosion resistance to high-temperature corrosive gases and has different emissivity depending on portions.

In order to solve the above problems, the heat-resistant member according to the present invention includes the following configuration.

(1) The heat-resistant member comprises:

a substrate made of isotropic graphite;

a single-layered dense low-emissivity layer covering part of surfaces of the substrate; and a single-layered or multi-layered dense high-emissivity layer covering all or part of the remaining surfaces of the substrate.

(2) The dense low-emissivity layer has an outermost surface with an emissivity of $\varepsilon_A$, and has a relative density of 97% or more.

(3) The dense high-emissivity layer has an outermost surface with an emissivity of $\varepsilon_B$ ($>\varepsilon_A$), and has a high-density region with a relative density of 97% or more in any portion between the outermost surface and the interface with the substrate.

Coating the surface of the substrate with the dense layers (dense low-emissivity layer and dense high-emissivity layer) improves corrosion resistance to high-temperature corrosive gases. In addition, heat flow within the heat-resistant member can be controlled by selectively coating the surface of the substrate with layers having different emissivity. Hence, when the heat-resistant member according to the present invention is applied to various members used in growth of a compound semiconductor single crystal, temperature distribution in single-crystal growth environment can be controlled more appropriately than before.

For example, when the heat-resistant member according to the present invention is used as a crucible for holding a raw material for sublimation used in growing a compound semiconductor single crystal using a sublimation method, the sublimation efficiency of the raw material for sublimation is improved. Further, when the heat-resistant member according to the present invention is used as a pedestal for holding a seed crystal, cooling efficiency of the seed crystal is improved. Furthermore, when the heat-resistant member according to the present invention is used as a heat shield plate disposed between the raw material for sublimation and the pedestal, thermal stress inside a growing crystal can be reduced, and thus high-quality, high-speed growth, and larger crystal size can be achieved.

DETAILED DESCRIPTION OF PREFERRED EMBODIMENTS

Figure 1:
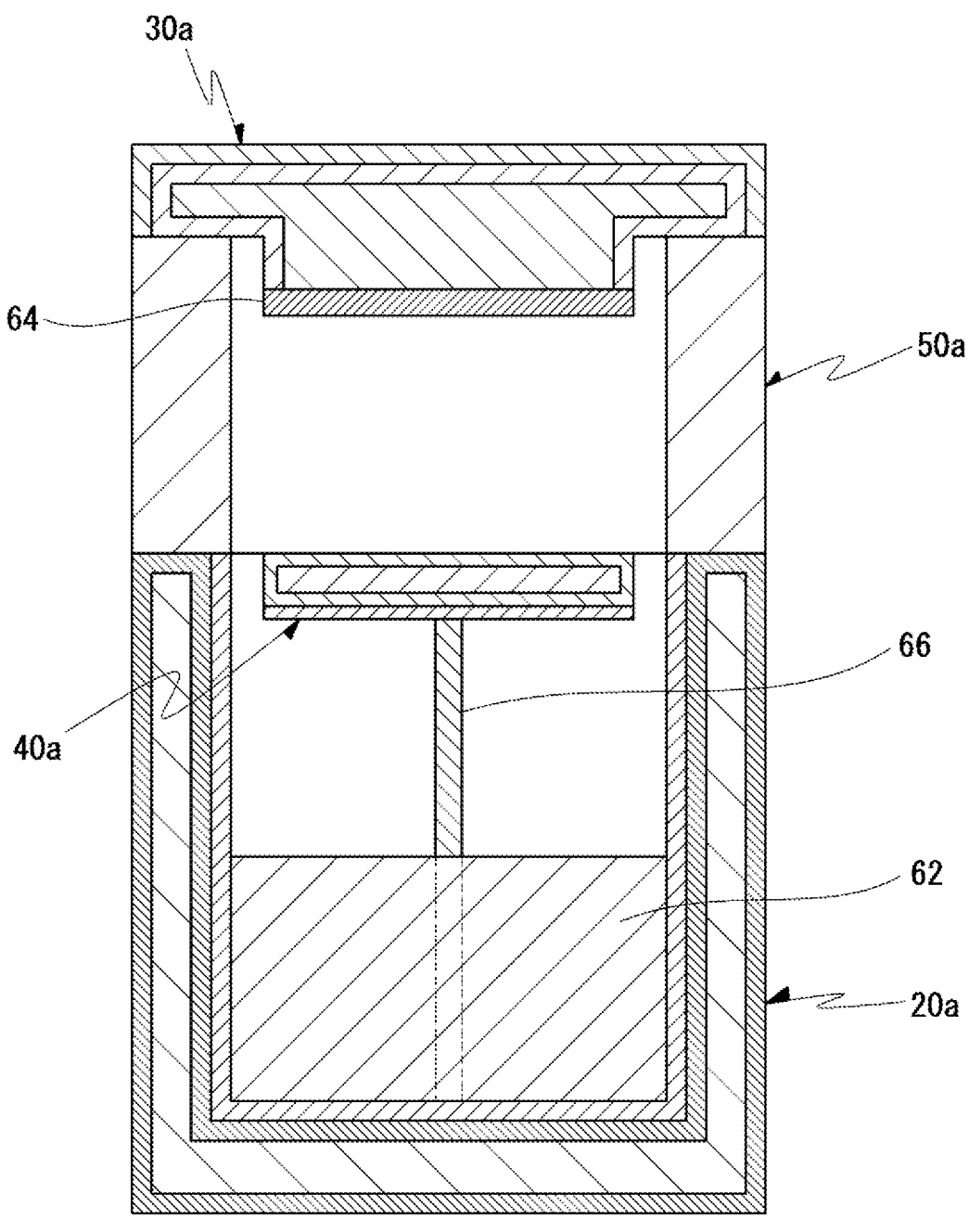
FIG. 1 is a schematic diagram of a compound semiconductor single-crystal growth device according to the present invention.

Hereinafter, one embodiment of the present invention will be described in detail.

1. Heat-Resistant Member

The heat-resistant member according to the present invention has the following configuration.

(1) The heat-resistant member comprises:

a substrate made of isotropic graphite;

a single-layered dense low-emissivity layer covering part of surfaces of the substrate; and a single-layered or multi-layered dense high-emissivity layer covering all or part of the remaining surfaces of the substrate.

(2) The dense low-emissivity layer has an outermost surface with an emissivity of $\varepsilon_A$, and has a relative density of 97% or more.

(3) The dense high-emissivity layer has an outermost surface with an emissivity of $\varepsilon_B$ ($>\varepsilon_A$), and has a high- 5                            6 density region with a relative density of 97% or more in any portion between the outermost surface and the interface with the substrate.

1.1 Substrate

1.1.1 Material

The substrate is made of isotropic graphite. The term "isotropic graphite" refers to a polycrystalline graphite material produced by a Cold Isostatic Press (CIP) process. Graphite belongs to the hexagonal crystal system and thus has anisotropic properties. Isotropic graphite characteristically has no characteristic difference due to the difference in cutting directions because crystal orientation of each crystal grain is non-orientated.

In the present invention, a shape, size, and the like of the substrate can be optimally selected without limitation according to a purpose. A specific example of a shape of the substrate will be described later.

1.1.2 Average Thermal Expansion Coefficient

The term "average thermal expansion coefficient" refers to an average value of thermal expansion coefficients in a temperature range from room temperature to 500° C.

The average thermal expansion coefficient of the substrate affects durability of the dense low-emissivity layer and the dense high-emissivity layer formed on a surface of the substrate. In general, the greater the difference in thermal expansion coefficient between the substrate and each of the layers, the more warpage of the substrate, separation of the layer, or the like tends to occur.

The average thermal expansion coefficient of the isotropic graphite typically has a value of approximately 3.8 to $7.0 \times 10^{-6}$/K depending on a manufacturing process or a composition of the isotropic graphite. Among various types of isotropic graphite, therefore, it is preferable to select one with an appropriate average thermal expansion coefficient as the material of the substrate.

1.2 Dense Low-Emissivity Layer

1.2.1 Emissivity $\varepsilon_A$

In the present invention, the "dense low-emissivity layer" refers to a layer that has an outermost surface with an emissivity of $\varepsilon_A$, and has relative density of 97% or more.

The dense low-emissivity layer is
(a) a layer to suppress heat radiation from the heat-resistant member to the outside, and to suppress temperature rise of other members near the dense low-emissivity layer, or
(b) a layer to promote reflection of heat incident from the outside, and to suppress temperature rise of the heat-resistant member.

The value of the emissivity $\varepsilon_A$ of the dense low-emissivity layer is not particularly limited as long as it is at least a value smaller than the emissivity $\varepsilon_B$ of the dense high-emissivity layer.

Emissivity depends primarily on a composition and relative density of material. It is therefore preferable to select a composition and/or relative density of the material of the dense low-emissivity layer such that $\varepsilon_A$ is smaller than $\varepsilon_B$.

The smaller the difference between $\varepsilon_B$ and $\varepsilon_A$, i.e., ($\varepsilon_B-\varepsilon_A$), the closer the amount of heat radiation (or reflection) from the dense low-emissivity layer to the amount of heat radiation (or reflection) from the dense high-emissivity layer. As a result, a smaller effect is obtained by forming layers with different emissivity on the surface of the heat-resistant member. Hence, $\varepsilon_B-\varepsilon_A$ is preferably 0.1 or more. More preferably, $\varepsilon_B-\varepsilon_A$ is 0.2 or more, further preferably 0.3 or more.

1.2.2 Relative Density

In the present invention, "relative density" refers to a ratio of apparent density to true density.

The dense low-emissivity layer is a layer for controlling radiation or reflection of heat, as well as a layer for protecting the substrate from corrosive atmosphere. For that purpose, the higher the relative density of the dense low-emissivity layer, the better. To suppress corrosion of the substrate over a long period of time, the relative density of the dense low-emissivity layer must be 97% or more. The relative density of the dense low-emissivity layer is preferably 98% or more, and more preferably 99% or more.

1.2.3 Number of Layers

The dense low-emissivity layer may include either a single layer or multiple layers, as long as the emissivity $\varepsilon_A$ and the relative density each meet the above condition. However, even if the dense low-emissivity layer is a multilayer, cost rather increases while no practical benefit is obtained. The dense low-emissivity layer is therefore preferably a single layer.

The term "single layer" refers to a layer that can be regarded as substantially homogeneous in composition and relative density.

In other words, "single layer" refers to a layer produced by a single manufacturing process with the same manufacturing method and the same manufacturing condition. In a layer manufactured by a single manufacturing process, fluctuation in composition or relative density may occur resulting from the manufacturing process. Alternatively, a reaction layer may be formed at the interface between the substrate and the dense low-emissivity layer. In the present invention, the dense low-emissivity layer is regarded as "single layer" even in such a case.

"Multiple layers" refers to a stack of layers having different compositions and/or different relative densities.

1.2.4 Material

Material of the dense low-emissivity layer is not particularly limited as long as the material satisfies the above conditions. Examples of the material of the dense low-emissivity layer include TaC, WC, a mixture of TaC and WC, ZrC, $Mo_2C$, and HfC.

1.2.5 Formation position, Area Ratio, Thickness

A formation position of the dense low-emissivity layer can be optimally selected without limitation according to the purpose. The dense low-emissivity layer is preferably formed at a location where heat radiation is desired to be suppressed and/or a location where heat reflection is desired to be promoted.

The dense low-emissivity layer covers part of the surfaces of the substrate. The area ratio of the dense low-emissivity layer to the total surface area of the substrate can be optimally selected without limitation according to the purpose.

Furthermore, thickness of the dense low-emissivity layer can be optimally selected without limitation according to the purpose. Thickness of the dense low-emissivity layer is typically 20 μm to 100 μm.

1.3 Dense High-Emissivity Layer

1.3.1 Emissivity $\varepsilon_B$

In the present invention, the "dense high-emissivity layer" refers to a layer that has an uppermost surface with an emissivity of $\varepsilon_B$ ($>\varepsilon_A$), and has a high-density region with a relative density of 97% or more in any portion between the uppermost surface and the interface with the substrate.

The dense high-emissivity layer is, (a) a layer to promote radiation of heat from the heat-resistant member to the outside, and to promote temperature rise of other members near the dense high-emissivity layer, or (b) a layer to promote absorption of heat incident from the outside, and to promote temperature rise of the heat-resistant member.

The amount of heat radiated from the dense high-emissivity layer is determined by emissivity of a material located on the uppermost surface. The dense high-emissivity layer may have at least an emissivity of $\varepsilon_B$ ($>\varepsilon_A$) at its uppermost surface.

Other aspects on the emissivity $\varepsilon_B$ are the same as those on the emissivity $\varepsilon_A$, and thus description thereof is omitted.

1.3.2 Relative Density

As with the dense low-emissivity layer, the dense high-emissivity layer is a layer for controlling radiation or reflection of heat, as well as a layer for protecting the substrate from corrosive atmospheres. For such a purpose, the higher the relative density of the dense high-emissivity layer, the better.

However, when the dense high-emissivity layer is a multilayer, not all layers need to have high density, and if at least one layer is a high-density layer, the substrate can be protected from corrosive atmospheres. In other words, the dense high-emissivity layer may be a layer that has a high-density region with a relative density of 97% or more in any portion between the outermost surface and the interface with the substrate. The high-density region may exist only on the substrate side or only on the surface side.

Other aspects on the relative density are the same as those on the dense low-emissivity layer, and thus description thereof is omitted.

1.3.3 Number of Layers

The dense high-emissivity layer may include a single layer or multiple layers, as long as its emissivity $\varepsilon_B$ and relative density each meet the above condition. In the case where the dense high-emissivity layer includes multiple layers, the number of layers is not particularly limited.

However, increasing the number of layers more than necessary provides no substantial effect and thus provides no practical benefit. It is therefore preferable to select the optimum number of layers depending on the purpose.

For example, the dense high-emissivity layer may include a first layer having a relative density of 97% or more formed on the substrate side, and a second layer having the emissivity $\varepsilon_B$ formed on the outermost surface side.

At least one additional layer may be provided between the first and second layers or between the substrate and the first layer. In this case, the additional layer may have any emissivity and relative density without limitation.

The first layer may have at least a relative density of 97% (dense layer), and its emissivity is not particularly limited. In other words, the first layer may be a layer with the emissivity $\varepsilon_A$ (low emissivity layer) or a layer with the emissivity $\varepsilon_B$ (high emissivity layer).

Similarly, the second layer may have at least the emissivity $\varepsilon_B$ (high emissivity layer), and its relative density is not particularly limited. In other words, the second layer may be a layer with a relative density of 97% or more (dense layer) or a layer with a relative density of less than 97% (porous layer).

In particular, the dense high-emissivity layer preferably includes a first layer having a high density and a low emissivity and a second layer having a low density and a high emissivity. Even if the first and second layers are made of the same material, emissivity of the second layer can be increased by simply decreasing relative density of the second layer. In addition, when a layer having high density and low emissivity is formed over the entire surfaces of the substrate and then a layer having a low density and a high emissivity is partially formed, a high emissivity layer can be easily formed on the surfaces of the substrate while the entire surfaces of the substrate is covered with the high-density layer.

1.3.4 Material

Material of the dense high-emissivity layer is not particularly limited, as long as the material meets the above conditions. Examples of the material of the dense high-emissivity layer include TaC, WC, a mixture of TaC and WC, ZrC, $Mo_2C$ and HfC.

1.3.5 Formation Position, Area Ratio, Thickness

The formation position of the dense high-emissivity layer can be optimally selected without limitation according to the purpose. A specific example of the formation position will be described later.

The dense high-emissivity layer covers each surface other than the surface covered with the dense low-emissivity layer among surfaces of the substrate. The ratio of the area of the dense high-emissivity layer to the total surface area of the substrate can be optimally selected without limitation according to the purpose.

Furthermore, thickness of the dense high-emissivity layer can be optimally selected without limitation according to the purpose. Thickness of the dense high-emissivity layer is typically 20 μm to 100 μm.

1.4 Application

The heat-resistant member according to the present invention is preferably used for various members used in growth of compound semiconductor single crystal. Examples of such members include a crucible for holding a raw material for sublimation, a pedestal for holding a seed crystal, the heat shield plate disposed between the raw material for sublimation and the pedestal, a heater, and a multiple heat shield.

Examples of the compound semiconductor to which the present invention is applied include silicon carbide, GaN, and AlN.

2. Specific Example

FIG. 1 shows a schematic cross-sectional diagram of a compound semiconductor single-crystal growth device according to the present invention. In FIG. 1, dimensions of each part are partially enlarged or reduced from the actual dimensions for easy viewing. The same applies to FIGS. 2 to 7 described later.

In FIG. 1, a compound semiconductor single-crystal growth device 10a is to grow a compound semiconductor single crystal (for example, silicon carbide single crystal) using a sublimation method, and includes a crucible 20a, a pedestal 30a, a heat shield plate 40a, and a spacer 50a.

The crucible 20a is to hold the raw material for sublimation (e.g., silicon carbide powder) 62. The heat-resistant member according to the present invention is used for the crucible 20a.

The spacer 50a is placed on the top end of the crucible 20a and the pedestal 30a is placed on the top end of the spacer 50a. The spacer 50a is to adjust a distance between the raw material for sublimation 62 and the pedestal 30a.

The pedestal 30a is to hold a seed crystal 64 on its surface on the side of the raw material for sublimation 62. The heat-resistant member according to the present invention is used for the pedestal 30a.

Further, the heat shield plate 40a is disposed between the raw material for sublimation 62 and the pedestal 30a. The heat shield plate 40a is supported by a support rod 66. The heat shield plate 40a blocks radiant heat incident from the raw material for sublimation 62 and suppresses an excessive increase in temperature of the seed crystal 64 or temperature of the growing crystal formed on the surface of the seed crystal 64. The heat-resistant member according to the present invention is used for the heat shield plate 40a.

2.1. Crucible

Figure 2:
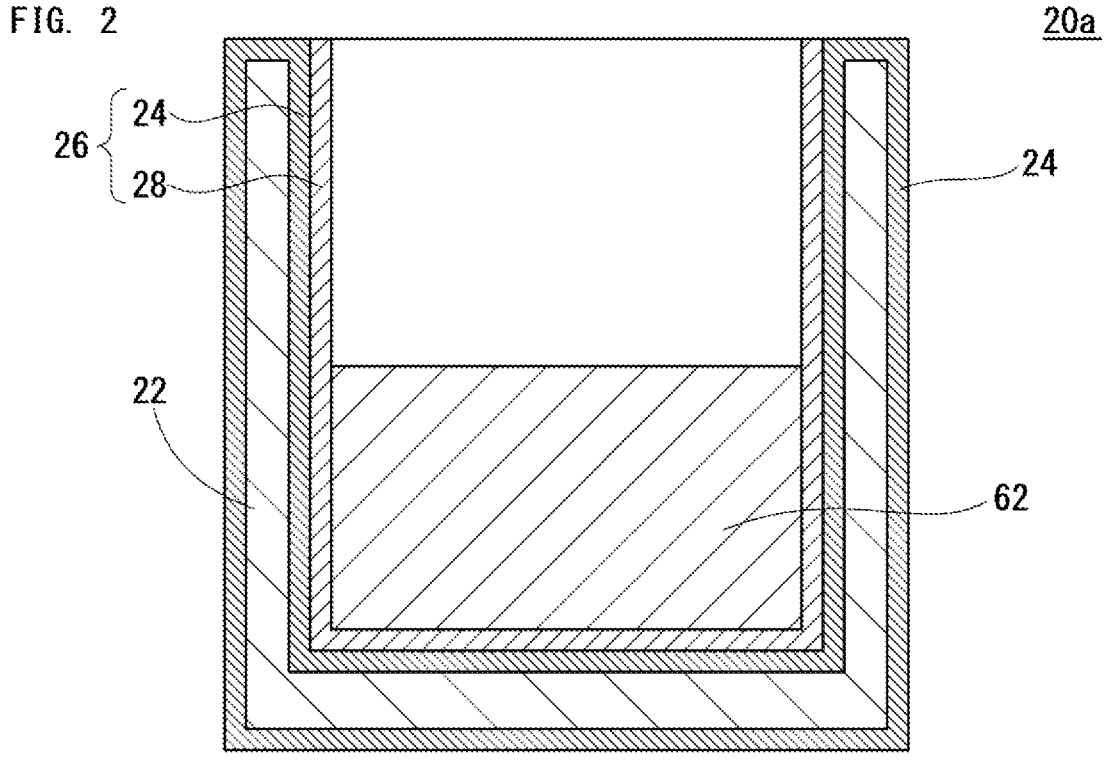
FIG. 2 is a schematic cross-sectional diagram of a crucible according to the present invention.

FIG. 2 shows a schematic cross-sectional diagram of a crucible according to the present invention. In FIG. 2, the crucible 20a is to hold the raw material for sublimation 62 when a compound semiconductor single crystal (e.g., silicon carbide single crystal) is manufactured using a sublimation method. The crucible 20a includes a crucible body 22, a dense low-emissivity layer 24, and a dense high-emissivity layer 26.

The crucible body 22 is made of isotropic graphite. A shape of the crucible body 22 can be optimally selected without limitation according to the purpose.

A single-layered dense low-emissivity layer 24 is formed on the outer wall surface of the crucible body 22. The dense low-emissivity layer 24, which is formed on the outer wall surface of the crucible body 22, suppresses heat radiation from the outer wall surface of the crucible 20a and suppresses reduction in temperature of the crucible 20a. The dense low-emissivity layer 24 may be formed on all or part of the outer wall surfaces (outer side surface, outer bottom surface, and top surface) of the crucible body 22. In the example shown in FIG. 2, the dense low-emissivity layer 24 is formed not only on all of the outer wall surfaces of the crucible body 22 but also on all of the inner wall surfaces thereof.

The dense high-emissivity layer 26 is provided on the inner wall surface of the crucible body 22. In the example shown in FIG. 2, the dense high-emissivity layer 26 has a double-layered structure including a dense layer (dense low-emissivity layer 24) formed on the inner wall surface of the crucible body 22 and a high-emissivity layer 28 formed on the surface of the dense layer. The dense high-emissivity layer 26 radiates heat towards the raw material for sublimation 62 inside the crucible 20a to promote sublimation of the raw material for sublimation 62. The dense high-emissivity layer 26 may be formed on all or part of the inner wall surfaces (inner side surface and inner bottom surface) of the crucible body 22. In the example shown in FIG. 2, the dense high-emissivity layer 26 is formed on all of the inner wall surfaces of the crucible body 22.

Respective materials of the dense low-emissivity layer 24 and the high-emissivity layer 28 can be optimally selected without limitation according to the purpose.

Examples of a combination of the materials of the dense low-emissivity layer 24 and the high-emissivity layer 28 include (a) a combination of dense TaC ($\varepsilon_A$=about 0.3) and porous TaC ($\varepsilon_B$=about 0.5) with a relative density of 50 to 80%, (b) a combination of dense TaC ($\varepsilon_A$=about 0.3) and dense WC ($\varepsilon_B$=about 0.6), and (c) a combination of dense WC ($\varepsilon_A$=about 0.6) and porous WC ($\varepsilon_B$=about 0.7) with a relative density of 50 to 80%.

2.2 Pedestal

Figure 3:
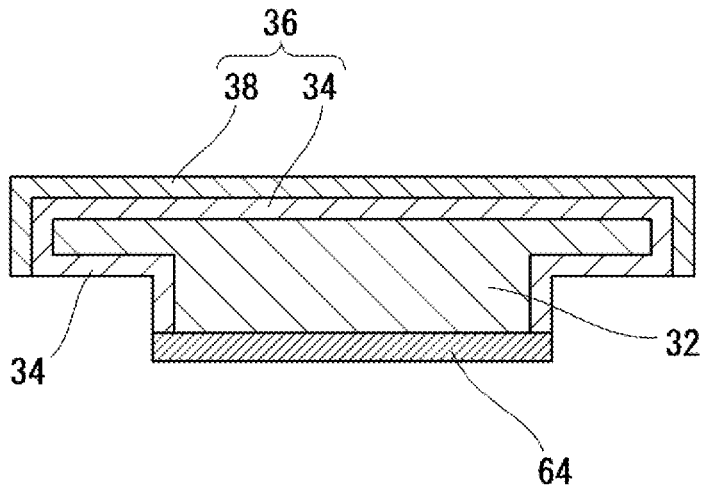
FIG. 3 is a schematic cross-sectional diagram of a pedestal according to the present invention.

FIG. 3 shows a schematic cross-sectional diagram of the pedestal according to the present invention. In FIG. 3, the pedestal 30a is to hold the seed crystal 64 in manufacturing a compound semiconductor single crystal (for example, silicon carbide single crystal) using a sublimation method. The pedestal 30a includes a pedestal body 32, a dense low-emissivity layer 34, and a dense high-emissivity layer 36.

The pedestal body 32 is made of isotropic graphite. A shape of the pedestal body 32 can be optimally selected without limitation according to the purpose.

A single-layered dense low-emissivity layer 34 is formed on each surface other than the bonding surface with the seed crystal 64 among surfaces of the pedestal body 32 on a side of the raw material for sublimation. The dense low-emissivity layer 34, which is formed on the surface of the pedestal body 32 on the side of the raw material for sublimation, reflects heat incident on the surface of the pedestal 30a on the side of the raw material for sublimation and suppresses temperature rise of the surface on the side of the raw material for sublimation. The dense low-emissivity layer 34 may be formed on all or part of the surfaces on the side of the raw material for sublimation other than the bonding surface with the seed crystal 64. In the example shown in FIG. 3, the dense low-emissivity layer 34 is formed not only on all of the surfaces other than the bonding surface with the seed crystal 64 among the surfaces on the side of the raw material for sublimation, but also on all of the side surfaces of the pedestal body 32 and all of the surfaces on a side opposite to the surfaces on the side of the raw material for sublimation (hereinafter also referred to as "back surfaces").

The dense high-emissivity layer 36 is formed on the back surface of the pedestal body 32. In the example shown in FIG. 3, the dense high-emissivity layer 36 has a double-layered structure including a dense layer (dense low-emissivity layer 34) formed on the back surface of the pedestal body 32 and a high-emissivity layer 38 formed on the surface of the dense layer. The dense high-emissivity layer 36 promotes heat radiation from the back surface of the pedestal 30a and promotes cooling efficiency of the seed crystal 64. The dense high-emissivity layer 36 may be formed on all or part of the back surfaces of the pedestal body 32. In the example shown in FIG. 3, the dense high-emissivity layer 36 is formed not only on all of the back surfaces of the pedestal body 32 but also on the side surfaces thereof.

Respective materials of the dense low-emissivity layer 34 and the high-emissivity layer 38 can be optimally selected without limitation according to the purpose. Since details of the combination of these materials are the same as those for the crucible 20*a*, description thereof is omitted.

2.3 Heat Shield Plate

Figure 4:
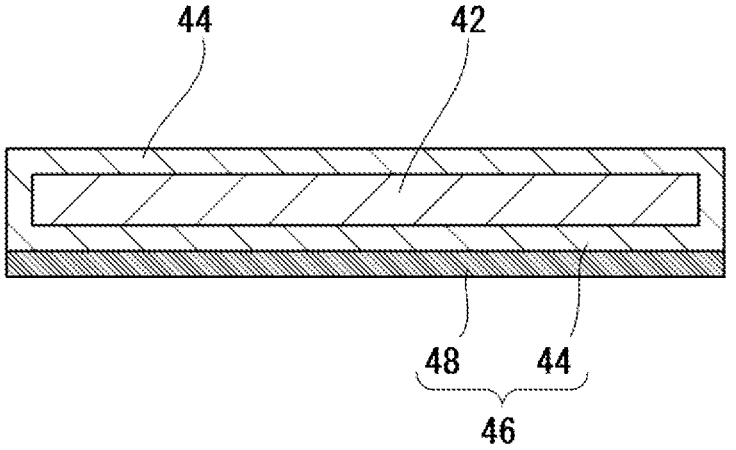
FIG. 4 is a schematic cross-sectional diagram of a heat shield plate according to the present invention.

FIG. 4 shows a schematic cross-sectional diagram of a heat shield plate according to the present invention. In FIG. 4, the heat shield plate 40*a* is to be disposed between the crucible 20*a* and the pedestal 30*a* when a compound semiconductor single crystal (for example, silicon carbide single crystal) is manufactured using a sublimation method. The heat shield plate 40*a* includes a heat shield plate body 42, the dense low-emissivity layer 44, and the dense high-emissivity layer 46.

The heat shield plate body 42 is made of isotropic graphite. A shape of the heat shield plate body 42 can be optimally selected without limitation according to the purpose.

A single-layered dense low-emissivity layer 44 is formed on the surface of the heat shield plate body 42 on the pedestal 30*a* side. The dense low-emissivity layer 44, which is formed on the surface of the heat shield plate body 42 on the pedestal 30*a* side, suppresses heat radiation from the surface of the heat shield plate 40*a* on the pedestal 30*a* side, and thus suppresses excessive temperature rise of the seed crystal 64. The dense low-emissivity layer 44 may be formed on all or part of the surfaces of the heat shield plate body 42 on the pedestal 30*a* side. In the example shown in FIG. 4, the dense low-emissivity layer 44 is formed not only on all of the surfaces on the pedestal 30*a* side, but also on all of the side surfaces of the heat shield plate body 42 and all of the surfaces on a side opposite to the surfaces of the heat shield plate body 42 on the pedestal 30*a* side (hereinafter referred to as "back surfaces").

The dense high-emissivity layer 46 is provided on the back surface of the heat shield plate body 42. In the example shown in FIG. 4, the dense high-emissivity layer 46 has a double-layered structure including a dense layer (dense low-emissivity layer 44) formed on the back surface of the heat shield plate body 42 and a high emissivity layer 48 formed on the surface of the dense layer. The dense high-emissivity layer 46 radiates heat toward the raw material for sublimation 62 within the crucible 20*a* and promotes sublimation of the raw material for sublimation. The dense high-emissivity layer 46 may be formed on all or part of the back surfaces of the heat shield plate body 42. In the example shown in FIG. 4, the dense high-emissivity layer 46 is formed on all of the back surfaces of the heat shield plate body 42.

Respective materials of the dense low-emissivity layer 44 and the high-emissivity layer 48 can be optimally selected without limitation according to the purpose. Since details of a combination of these materials are the same as those for the crucible 20*a*, description thereof is omitted.

3. Method for Manufacturing Heat-Resistant Members

The heat-resistant member according to the present invention can be manufactured by various methods. Of these, sintering method is preferable as a method for manufacturing the heat-resistant member because porosity is easily adjusted.

The term "sintering method" refers to a method, in which (a) first slurry containing a raw material for forming the dense low-emissivity layer is applied to all or part of the surfaces of a substrate made of isotropic graphite, and is dried to form a first formed film on the surface/surfaces of the substrate, (b) second slurry containing a raw material for forming the dense high-emissivity layer is applied to part of the surfaces of the substrate, and is dried to form a second formed film on the surface/surfaces of the substrate, and (c) the substrate on which the first and second formed films are formed is heated in an inert atmosphere to sinter the first formed film and the second formed film.

3.1 First Step

First, the first slurry containing the raw material for forming the dense low-emissivity layer is applied to all or part of the surfaces of the substrate made of isotropic graphite, and is dried (first step). As a result, the first formed film can be formed on the surface/surfaces of the substrate.

The first slurry includes a raw material for forming the dense low-emissivity layer. The first formed film is a layer to be the dense low-emissivity layer after sintering. If the raw material for forming the dense low-emissivity layer is hardly sinterable material, an appropriate amount of sintering aid is added to the first slurry. For example, when TaC or WC is used as the raw material for the dense low-emissivity layer, Co is preferably used as the sintering aid. The first slurry may further include an organic binder, a dispersant, and the like, if necessary.

The average particle diameter of the raw material powder, a type and the amount of the sintering aid, and a composition of the first slurry can each be optimally selected without limitation according to the purpose. For example, TaC or WC preferably has an average particle diameter of 1 to 3 μm to facilitate densification.

In general, if an excessively small amount of the sintering aid is added to the first slurry, densification does not proceed sufficiently and porosity increases. On the other hand, if excessively large amount of the sintering aid is added, the sintering aid may remain in the dense low-emissivity layer, and the residual sintering aid may leak out during use and become a source of contamination. A preferable additive amount of the sintering aid varies depending on types of the sintering aid. For example, when the sintering aid is Co, the additive amount of the sintering aid is preferably 0.1 to 5 mass %.

3.2 Second Step

Subsequently, the second slurry containing the raw material for forming the dense high-emissivity layer is applied to part of the surfaces of the substrate, and is dried (second step). As a result, the second formed film can be formed on the part of the surfaces of the substrate.

The second slurry may be a slurry capable of forming a single-layered dense high-emissivity layer by itself. In this case, the first slurry is applied to part of the surfaces of the substrate to form the first formed film, and then the second slurry capable of forming a single-layered dense high-emissivity layer may be applied on all or part of the remaining surfaces of the substrate to form the second formed film.

The second slurry may be a slurry capable of forming a layer (for example, porous high-emissivity layer) that becomes the dense high-emissivity layer by combining with another layer (for example, a dense low-emissivity layer). In this case, application of the second slurry and formation of the second formed film may be performed only once, or may be repeated two or more times.

For example, when the dense high-emissivity layer includes a stacked body of the dense low-emissivity layer and the porous high-emissivity layer, the first slurry is first applied to all or part of the surfaces of the substrate to form a first formed film. Subsequently, the second slurry that can form the porous high-emissivity layer is applied to part of the surfaces of the first formed film to form the second formed film. This method advantageously provides a large degree of freedom in material selection because emissivity can be controlled by both the composition and the relative density of the material.

A composition of the second slurry can be optimally selected without limitation according to the purpose. For example, when the second slurry is to form a porous layer and when a hardly sinterable material such as TaC or WC is used as the raw material of the porous layer, the second slurry need not contain a sintering aid. A second slurry containing no sintering aid can be rather used to form the porous layer more easily. Other aspects on the second slurry are the same as those on the first slurry, and thus description thereof is omitted.

3.3 Third Step

Subsequently, the substrate, on which the first formed film and the second formed film are formed, is heated in an inert atmosphere to sinter the first formed film and the second formed film (third step). As a result, the heat-resistant member according to the present invention is produced.

A sintering condition is optimally selected depending on respective compositions of the first formed film and the second formed film. The optimum sintering condition differs depending on properties of the raw material powder, compositions of the slurries, and the like. For example, when the raw material powder includes TaC or WC, the formed films are preferably heated at 2000 to 2300° C. for about 0.5 to 1.0 hr.

4. Effects

Coating the surface of the substrate with the dense layers (dense low-emissivity layer and dense high-emissivity layer) improves corrosion resistance to high-temperature corrosive gases. In addition, heat flow within the heat-resistant member can be controlled by selectively coating the surface of the substrate with layers having different emissivity. Hence, when the heat-resistant member according to the present invention is applied to various members used in growth of a compound semiconductor single crystal, temperature distribution of the single crystal growth environment can be controlled more appropriately than before.

For example, when the heat-resistant member according to the present invention is used as a crucible for holding a raw material for sublimation used in growth of a compound semiconductor single crystal using a sublimation method, the sublimation efficiency of the raw material for sublimation is improved. Further, when the heat-resistant member according to the present invention is used as a pedestal for holding a seed crystal, cooling efficiency of the seed crystal is improved. Furthermore, when the heat-resistant member according to the present invention is used as a heat shield plate disposed between the raw material for sublimation and the pedestal, thermal stress inside a growing crystal can be reduced, and thus high-quality, high-speed growth, and larger crystal size can be achieved.

EXAMPLES

Example 1, Comparative Examples 1 and 2

1. Fabrication of Compound Semiconductor Single-Crystal Growth Device

1.1 Example 1

A compound semiconductor single-crystal growth device 10a as shown in FIGS. 1 to 4 was fabricated.

First, the crucible body 22, the pedestal body 32, the heat shield plate body 42, and the spacer 50a, each made of isotropic graphite, were prepared. Of these, the spacer 50a was used for a test as it was. On the other hand, the dense low-emissivity layer and the dense high-emissivity layer were formed on the surfaces of the crucible body 22, the pedestal body 32, and the heat shield plate body 42 according to the following procedure.

TaC having an average particle size of 1 to 3 μm, Co powder (equivalent to 1.0 mass %) as a sintering aid, and a binder were added to an organic solvent and mixed to produce the first slurry.

Further, TaC having an average particle size of 1 to 3 μm and a binder were added to an organic solvent and mixed to produce the second slurry.

The first slurry was sprayed to the entire surfaces of the crucible body 22 and the heat shield plate body 42 to form the first formed film. Further, the first slurry was sprayed to the entire surfaces of the pedestal body 32 other than the bonding surface with the seed crystal to form the first formed film. The thickness of the first formed film was set so that film thickness after densification would be 50 to 100 μm. The substrate with the first formed film was heated on a hot plate at 150° C. for 30 min to volatilize the organic solvent contained in the first formed film.

Subsequently, the second slurry was sprayed to part of the surfaces of the crucible body 22, the pedestal body 32, and the heat shield plate body 42 to form the second formed film. Thickness of the second formed film was 10 to 30 μm.

Furthermore, the substrate with the first formed film and the second formed film was held at 2000° C. for 1 hr in Ar atmosphere and thus sintered.

1.2 Comparative Example 1

Figure 5:
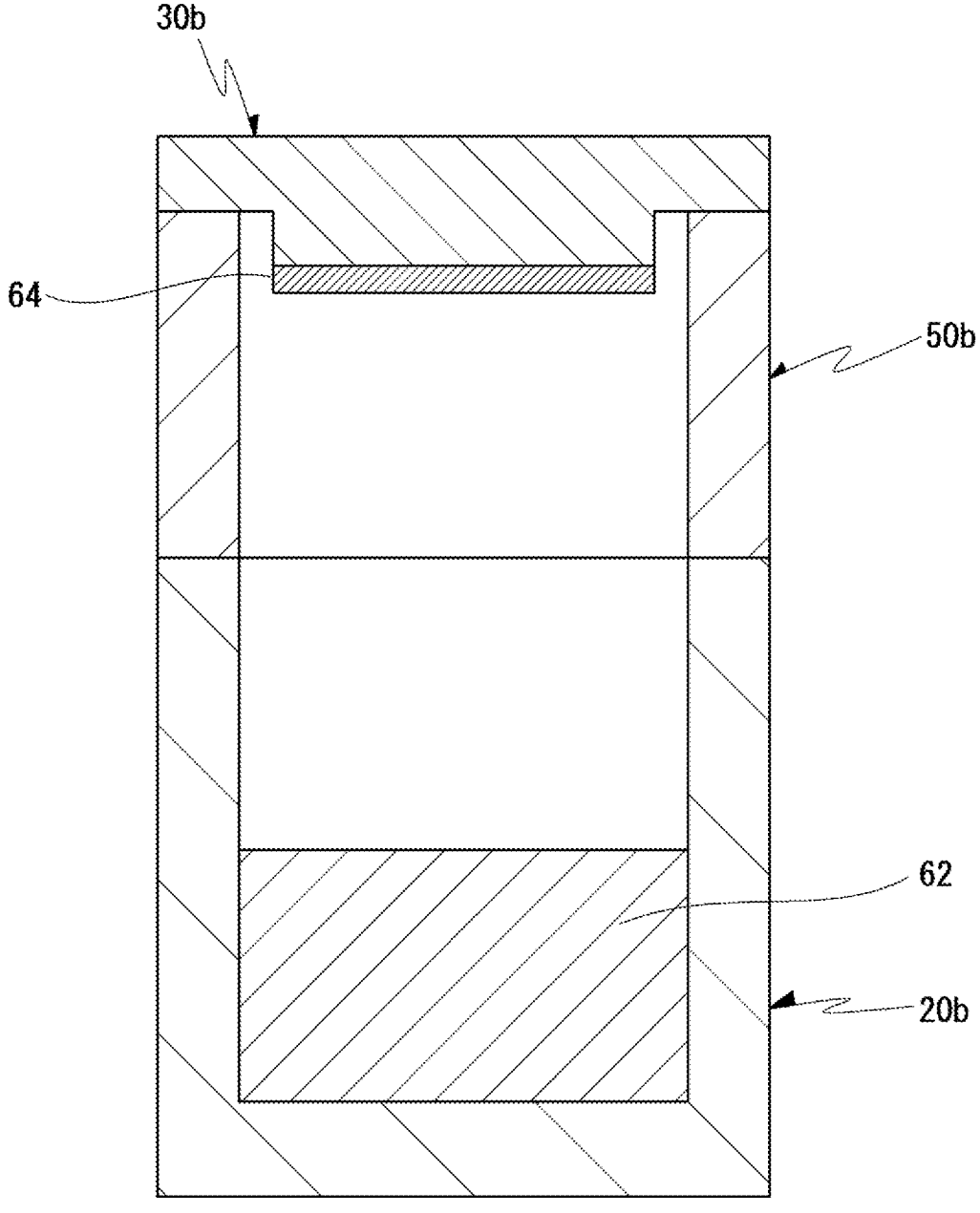
FIG. 5 is a schematic diagram of a compound semiconductor single-crystal growth device of Comparative Example 1.

A compound semiconductor single-crystal growth device 10b shown in FIG. 5 was fabricated. In FIG. 5, the compound semiconductor single-crystal growth device 10b includes a crucible 20b for holding the raw material for sublimation 62, a pedestal 30b for holding the seed crystal 64, and a spacer 50b for adjusting a distance between the crucible 20b and the pedestal 30b. The crucible 20b and the pedestal 30b are made only of isotropic graphite. The compound semiconductor single-crystal growth device 10b has no heat shield plate. The Comparative Example 1 is different from the Example 1 in these aspects. Other aspects on the compound semiconductor single-crystal growth device 10*b* are the same as in the Example 1, and thus description thereof is omitted.

1.3 Comparative Example 2

Figure 6:
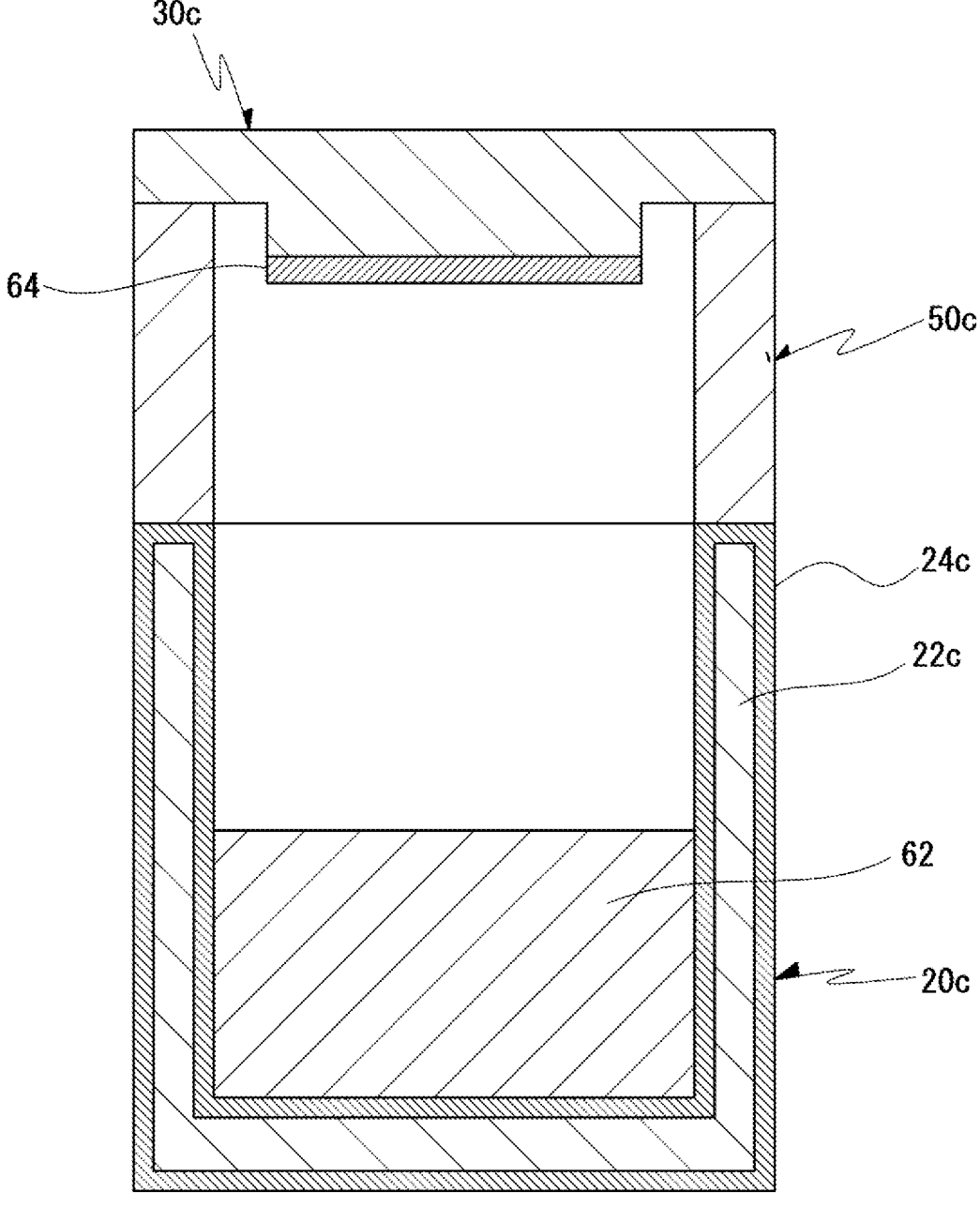
FIG. 6 is a schematic diagram of a compound semiconductor single-crystal growth device of Comparative Example 2.

A compound semiconductor single-crystal growth device shown in FIG. 6 was fabricated. In FIG. 6, the compound semiconductor single-crystal growth device 10*c* includes a crucible 20*c* for holding the raw material for sublimation 62, a pedestal 30*c* for holding the seed crystal 64, and a spacer 50*c* for adjusting a distance between the crucible 20*c* and the pedestal 30*c*. The crucible 20*c* includes a crucible body 22*c* made of isotropic graphite and a dense low-emissivity layer 24*c* formed on surfaces of the crucible body 22*c*. The pedestal 30*c* is made only of isotropic graphite. In addition, the compound semiconductor single-crystal growth device 10*c* has no heat shield plate. The Comparative Example 2 is different from the Example 1 in these aspects. Other aspects on the compound semiconductor single-crystal growth device 10*c* are the same as in the Example 1, and thus description thereof is omitted.

2. Test Method

A seed crystal was bonded to the pedestal, and such a pedestal was disposed on the top of the crucible filled with the raw material for sublimation. A silicon carbide single crystal with a diameter of 150 mm was used as the seed crystal. Silicon carbide powder was used as the raw material for sublimation. The compound semiconductor single-crystal growth device was housed in a vessel, and the inside of the vessel was evacuated. Then, Ar gas was introduced into the vessel. Ar pressure was set to 200 Pa. Subsequently, the pedestal was heated to 2200° C. while the crucible was heated to 2400° C., and such a state was held for 72 hr to grow a silicon carbide single crystal on the surface of the seed crystal. The growth rate was calculated from height of the grown crystal. Weight reduction rate of the crucible was calculated from a difference in crucible weight before and after the growth.

3. Results

Table 1 shows the results. Table 1 reveals the following.

(a) Growth rate was higher and weight reduction rate of the crucible was lower in the Example 1 than in the Comparative Example 1. The reason for the higher growth rate in the Example 1 than in the Comparative Example 1 is probably that the high emissivity layer is formed on the inner wall surface of the crucible and the low emissivity layer is formed on the outer wall surface thereof. The reason for the lower weight reduction rate of the crucible in the Example 1 than in the Comparative Example 1 is probably that the entire surfaces of the crucible are covered with the dense layer.

(b) The weight reduction rate of the crucible in the Comparative Example 2 was roughly the same as in the Example 1. However, the growth rate was slower in the Comparative Example 2 than in the Example 1. This is probably because since the inner wall surface of the crucible includes the low-emissivity layer and no heat shield plate is provided, sublimation efficiency of the silicon carbide powder is reduced.

TABLE 1

|  | Growth rate μm/h | Weight reduction rate of crucible g/m²/h |
|---|---|---|
| Example 1 | 393 | 0.19 |
| Comparative Example 1 | 306 | 1.50 |
| Comparative Example 2 | 330 | 0.17 |

Example 2

1. Test Method

Figure 7:
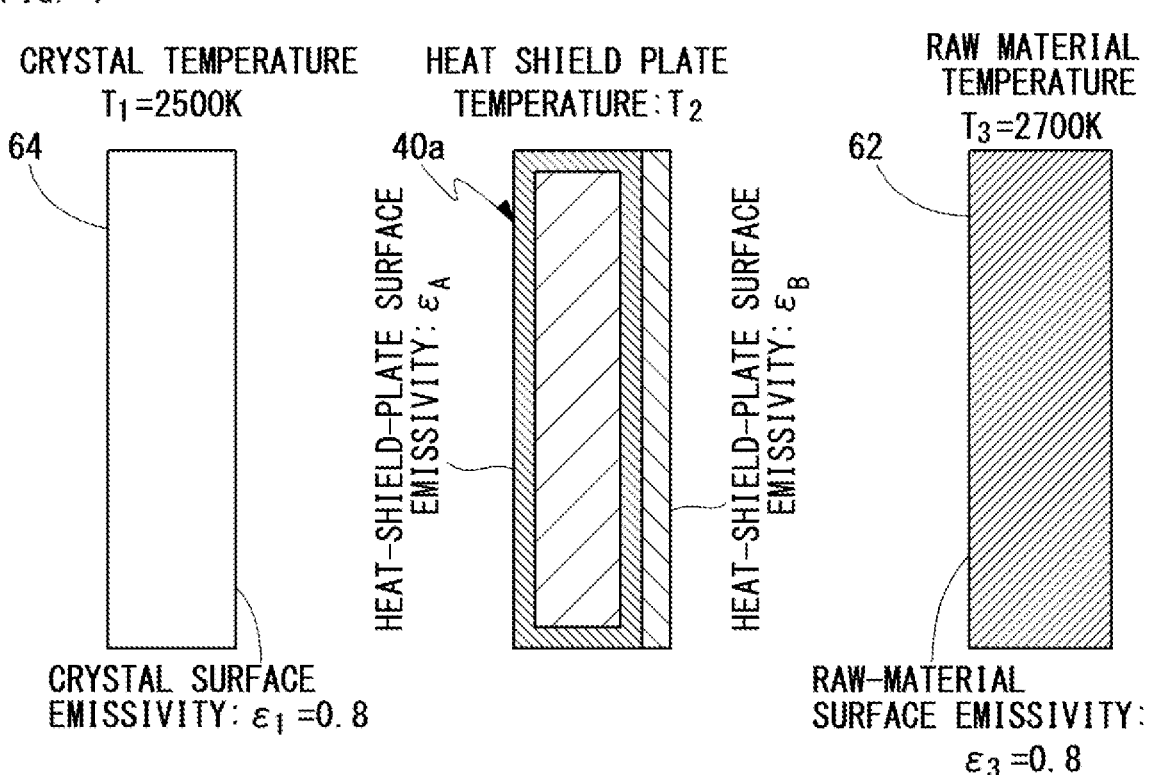
FIG. 7 is a one-dimensional layout drawing for calculating temperature of a heat shield plate.

FIG. 7 illustrates a one-dimensional layout drawing for calculating temperature of the heat shield plate. As shown in FIG. 7, it is assumed that the seed crystal 64, the heat shield plate 40*a*, and the raw material for sublimation 62 are arranged one-dimensionally at predetermined intervals. It is further assumed that a low-emissivity layer with an emissivity of $\varepsilon_A$ is formed on the surface of the heat shield plate 40*a* on the seed crystal 64 side, while a high-emissivity layer with an emissivity of $\varepsilon_B$ is formed on the surface thereof on the side of the raw material for sublimation 62.

It is further assumed that the surface of the seed crystal 64 has a temperature $T_1$ of 2500K and an emissivity $\varepsilon_1$ of 0.8. It is further assumed that the surface of the raw material for sublimation 62 has a temperature $T_3$ of 2700K and an emissivity $\varepsilon_3$ of 0.8.

Effects of the emissivity difference $(\varepsilon_B-\varepsilon_A)$ on the temperature $T_2$ of the heat shield plate 40*a* under such conditions were determined by simulation. The temperature $T_2$ was calculated from the following formula (1).

[Math. 1]

$$\frac{T_1^4 - T_2^4}{\dfrac{1}{\varepsilon_1} + \dfrac{1}{\varepsilon_A} - 1} = \frac{T_2^4 - T_3^4}{\dfrac{1}{\varepsilon_B} + \dfrac{1}{\varepsilon_3} - 1} \qquad (1)$$

2. Results

Figure 8:
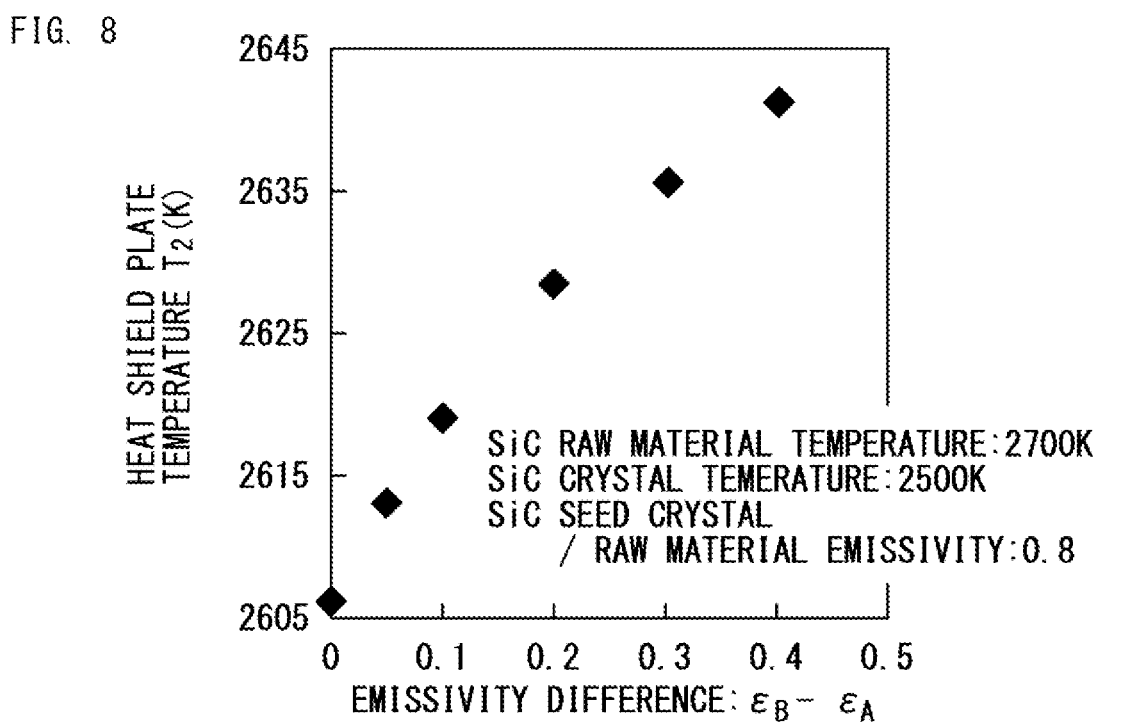
FIG. 8 is a diagram showing emissivity difference dependency of the heat shield plate temperature.

FIG. 8 Shows emissivity difference dependency of the heat shield plate temperature. Table 2 shows combinations of material on the seed crystal surface side and material on the raw material surface side. FIG. 8 and Table 2 reveal the following.

(1) The temperature $T_2$ of the heat shield plate increased with an increase in emissivity difference. This is probably because the heat shield plate is more likely to be received radiation from the raw material, while radiation from the heat shield plate to the seed crystal side is reduced.

(2) When the emissivity difference was 0.1 or more, $T_2$ increased by 10° C. or more compared to the case where the emissivity difference was zero ($\varepsilon_A$ and $\varepsilon_B$ are both 0.3).

17

18

TABLE 2

| | Material on seed crystal surface side ($\varepsilon_A$) | / | Material on raw material surface side ($\varepsilon_B$) | Emissivity difference $\varepsilon_A - \varepsilon_B$ | Heat shield plate temperature (K) |
|---|---|---|---|---|---|
| No. 1 | TaC(0.3) | / | TaC(0.3) | 0 | 2606 |
| No. 2 | TaC(0.3) | / | TaC(0.35) | 0.05 | 2613 |
| No. 3 | TaC(0.3) | / | TaC(0.4) | 0.1 | 2619 |
| No. 4 | TaC(0.3) | / | p-TaC(0.5) | 0.2 | 2628 |
| No. 5 | TaC(0.3) | / | WC(0.6) | 0.3 | 2635 |
| No. 6 | TaC(0.3) | / | p-WC(0.7) | 0.4 | 2641 |

Although one embodiment of the invention has been described in detail above, the invention is not limited in any way to the embodiment, but can be modified in various ways without departing from the gist of the invention.

The heat-resistant member according to the present invention can be used for crucibles, susceptors, heater members, evaporation boats, and reflector members for growing crystals or thin films including compound semiconductors.

REFERENCE SIGNS LIST 10a to 10c Compound semiconductor single-crystal growth device
20a to 20c Crucible
30a to 30c Pedestal
40a Heat shield plate
62 Raw material for sublimation
64 Seed crystal
The invention claimed is:

1. A heat-resistant member, comprising:
a substrate made of isotropic graphite;
a single-layered dense low-emissivity layer covering part of surfaces of the substrate; and
a single-layered or multi-layered dense high-emissivity layer covering all or part of the remaining surfaces of the substrate, wherein the dense low-emissivity layer has an outermost surface with an emissivity of $\varepsilon_A$, and has a relative density of 97% or more, and the dense high-emissivity layer has an outermost surface with an emissivity of $\varepsilon_B$ ($>\varepsilon_A$), and has a high-density region with a relative density of 97% or more in any portion between the outermost surface and the interface with the substrate.

2. The heat-resistant member according to claim 1, wherein the heat-resistant member is used in growth of a compound semiconductor single crystal.

3. The heat-resistant member according to claim 1, wherein the heat-resistant member satisfies $\varepsilon_B-\varepsilon_A\geq0.1$.

4. The heat-resistant member according to claim 1, wherein the dense high-emissivity layer includes:
a first layer having a relative density of 97% or more formed on the substrate side, and a second layer having an emissivity of $\varepsilon_B$ formed on the outermost surface side.

5. The heat-resistant member according to claim 1, wherein the dense low-emissivity layer includes TaC, WC, or a mixture of TaC and WC.

6. The heat-resistant member according to claim 1, wherein the dense high-emissivity layer includes TaC, WC, or a mixture of TaC and WC.

7. The heat-resistant member according to claim 1, wherein the heat-resistant member is a crucible to hold a raw material for sublimation used when a compound semiconductor single crystal is manufactured using a sublimation method, and the crucible includes:
a crucible body made of the isotropic graphite;
the dense low-emissivity layer formed on all or part of outer wall surfaces of the crucible body; and
the dense high-emissivity layer formed on all or part of inner wall surfaces of the crucible body.

8. The heat-resistant member according to claim 1, wherein the heat-resistant member is a pedestal to hold a seed crystal for growth of a compound semiconductor single crystal, and the pedestal includes:
a pedestal body made of the isotropic graphite;
the dense low-emissivity layer formed on all or part of surfaces other than a bonding surface with the seed crystal among surfaces of the pedestal body on a side of a raw material for sublimation; and
the dense high-emissivity layer formed on all or part of surfaces on a side opposite to the surfaces of the pedestal body on the side of the raw material for sublimation.

9. The heat-resistant member according to claim 1, wherein the heat-resistant member is a heat shield plate disposed between a crucible to hold a raw material for sublimation used in manufacturing a compound semiconductor single crystal using a sublimation method and a pedestal to hold a seed crystal for growth of the compound semiconductor single crystal, and the heat shield plate includes:
a heat shield plate body made of the isotropic graphite;
the dense low-emissivity layer formed on all or part of surfaces of the heat shield plate body on the pedestal side; and
the dense high-emissivity layer formed on all or part of surfaces on a side opposite to the surfaces of the heat shield plate body on the pedestal side.

10. A heat-resistant member, comprising:
a substrate made of isotropic graphite;
a single-layered dense low-emissivity layer covering part of surfaces of the substrate; and
a single-layered or multi-layered dense high-emissivity layer covering all or part of the remaining surfaces of the substrate, wherein the dense low-emissivity layer has an outermost surface with an emissivity of $\varepsilon_A$, and has a relative density of 97% or more, and the dense high-emissivity layer has an outermost surface with an emissivity of $\varepsilon_B$ ($>\varepsilon_A$), and has a high-density region with a relative density of 97% or more in any portion between the outermost surface and the interface with the substrate, wherein the dense low-emissivity layer includes TaC and/or WC and at least one of ZrC, Mo$_2$C, and HfC and wherein the dense high-emissivity layer includes TaC and/or WC and at least one of ZrC, Mo$_2$C, and HfC.

11. The heat-resistant member according to claim 10, wherein the heat-resistant member is used in growth of a compound semiconductor single crystal.

12. The heat-resistant member according to claim 10, wherein the heat-resistant member satisfies $\varepsilon_B-\varepsilon_A\geq0.1$.

13. The heat-resistant member according to claim 10, wherein the dense high-emissivity layer includes:
a first layer having a relative density of 97% or more formed on the substrate side, and a second layer having an emissivity of EB formed on the outermost surface side.

14. A heat-resistant member, comprising:
a substrate made of isotropic graphite;
a single-layered dense low-emissivity layer covering part of surfaces of the substrate; and a single-layered or multi-layered dense high-emissivity layer covering all or part of the remaining surfaces of the substrate, wherein the dense low-emissivity layer has an outermost surface with an emissivity of $\varepsilon_A$, and has a relative density of 97% or more, and the dense high-emissivity layer has an outermost surface with an emissivity of $\varepsilon_B$ ($>\varepsilon_A$), and has a high-density region with a relative density of 97% or more in any portion between the outermost surface and the interface with the substrate, wherein the dense low-emissivity layer includes TaC and/or WC and at least one of ZrC, $Mo_2C$, and HfC or wherein the dense high-emissivity layer includes TaC and/or WC and at least one of ZrC, $Mo_2C$, and HfC.

\* \* \* \* \*